United States Patent [19]

Cook, Jr.

[11] 4,075,754
[45] Feb. 28, 1978

[54] SELF ALIGNED GATE FOR DI-CMOS

[75] Inventor: Koy B. Cook, Jr., Mount View, Calif.

[73] Assignee: Harris Corporation, Cleveland, Ohio

[21] Appl. No.: 671,772

[22] Filed: Mar. 30, 1976

Related U.S. Application Data

[63] Continuation of Ser. No. 445,861, Feb. 26, 1974, abandoned.

[51] Int. Cl.² .................................... B01J 17/00
[52] U.S. Cl. .................................... 29/571; 29/578
[58] Field of Search ............... 29/571, 578, 576 IW, 29/590; 357/22, 23, 42, 91, 89, 90

[56] References Cited

U.S. PATENT DOCUMENTS

| 3,223,904 | 12/1965 | Warner | 357/22 |
| 3,653,978 | 4/1972 | Robinson | 357/89 |
| 3,673,679 | 7/1972 | Carbajal | 29/571 |
| 3,679,492 | 7/1972 | Fang | 29/571 |
| 3,717,790 | 2/1973 | Dalton | 357/91 |
| 3,731,372 | 5/1973 | Kraft | 29/590 |
| 3,750,268 | 8/1973 | Wang | 29/571 |
| 3,789,503 | 2/1974 | Nishida | 29/571 |
| 3,789,504 | 2/1974 | Jaddam | 29/571 |

Primary Examiner—W. Tupman
Attorney, Agent, or Firm—Leitner, Palan & Martin

[57] ABSTRACT

A process for fabricating complementary metal oxide semiconductors including doping to determine threshold voltage of a first conductivity channel device with second conductivity type impurities, counter-doping to determine the threshold voltage of a second conductivity channel device with second conductivity impurities, forming gate oxide, forming metal gate, and forming source and drain regions using the metal gate as a self-aligned mask. Preferably, the doping steps are performed using ion implantation and photoresist mask.

20 Claims, 9 Drawing Figures

SELF ALIGNED GATE FOR DI-CMOS

This is a continuation, of application Ser. No. 445,861, filed Feb. 26, 1974, now abandoned.

BACKGROUND OF THE INVENTION

1. Field of the Invention

The present invention relates generally to processes for the fabrication of metal oxide semiconductors and more particularly to a process of making complementary metal oxide semiconductors in dielectrically isolated regions using a self-aligned gate.

2. Description of the Prior Art

In the field of semiconductor processes, many techniques are used for the formation of complementary metal oxide semiconductors. A major trend in the industry has been the use of the gate metal as a mask for the extension of previously formed source and drain regions to the edge of the gate and therefore form a self-aligned channel region. The extension of source and drain regions using the gate metal as a mask has been performed using ion implantation as well as open tube diffusion.

The processes of the prior art for the formation of complementary MOS devices involves lengthy expensive processing. Techniques now used in industry have not been able to provide the CMOS's with well controlled threshold levels while maintaining high packing density.

SUMMARY OF THE INVENTION

The present process provides an economical and high packing density CMOS with controlled threshold voltages. The process includes an initial doping of regions of a first conductivity channel device with a second conductivity type impurity to determine the threshold voltage said first conductivity channel device, counter doping areas in which second conductivity channel devices are to be formed with second conductivity impurities to determine its threshold voltage. The processes are completed by formation of gate oxide, the formation of metal gates, and the formation of source and drain regions using the metal gates as self-aligning masks. Preferably, all of the doping steps are performed using ion implanation. It is the use of ion implanation which provides the control of the threshold voltages. The gate metal is preferably polycrystalline silicon. The process includes the use of photoresist as a mask for ion implanation.

OBJECTS OF THE INVENTION

An object of the present invention is to provide a process for forming CMOS's using ion implanation for all semiconductor doping.

Another object of the invention is to provide an economical and high packing density CMOS circuit using ion implantation and self-aligned gate techniques.

A further object of the invention is to provide a process for formation of CMOS devices in totally dielectrically isolated substrates or substrates with a combination of sidewall dielectric isolation and bottom junction isolation.

Still another object of the invention is to provide a process wherein the threshold voltages of all MOS devices are controlled by an ion implantation step and any threshold voltage that is desirable can be achieved on either the P channel or N channel devices.

A still further object of the invention is the utilization of polycrystalline silicon as the gate metal and its use in the self-aligned gate technique.

An even further object of the invention is the provision for the fabrication of CMOS devices using photoresist as a mask for ion implantation.

Other objects, advantages and novel features of the present invention will become apparent from the following detailed description of the invention when considered in conjunction with the accompanying drawings.

DESCRIPTION OF PREFERRED EMBODIMENTS

The process of the present invention as illustrated in FIGS. 1–7 fabricates a CMOS transistor structure suitable for high density, fast CMOS circuits. The process uses ion implantation for semiconductor doping to control the CMOS threshold voltages and, where necessary, the CMOS breakdown voltages.

Figure 1:
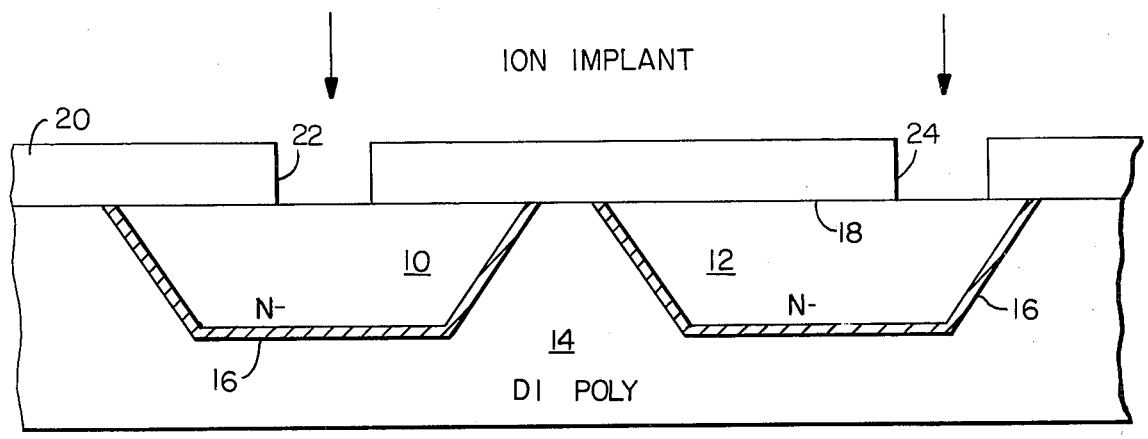
FIGS. 1–7 illustrate the formation of CMOS devices at various stages using the process of the present invention.

The basic self-aligned dielectrically isolated CMOS process begins with a wafer of N conductivity type silicon processed through a standard Harris dielectrically isolated material process to form N type islands 10 and 12, separated from a polycrystalline silicon 14 by dielectric insulative layers 16. The process to form the substrate as illustrated in FIG. 1 is disclosed in a commonly assigned copending application Ser. No. 204,821, filed Dec. 6, 1971.

The wafer with the islands having a planar surface 18 is processed through a make-up followed by a pre-oxidation cleaning, a photoresist priming with silizane primer, photoresist adherence and then an immediate application of a photoresist emulsion. The photoresist layer 20, having a thickness of approximately 10,000 angstroms, is exposed through a mask, developed and etched to form apertures 22 and 24 which exposes regions of surface 18 of islands 10 and 12, respectively. The mask defines the P$^-$ regions which define the body of the N channel MOS device to be formed in island 10 and the drain of the P channel MOS device to be formed in island 12. The sheet resistance of the P$^-$ regions determines the N channel threshold voltage for a given DI island depth.

Figure 2:
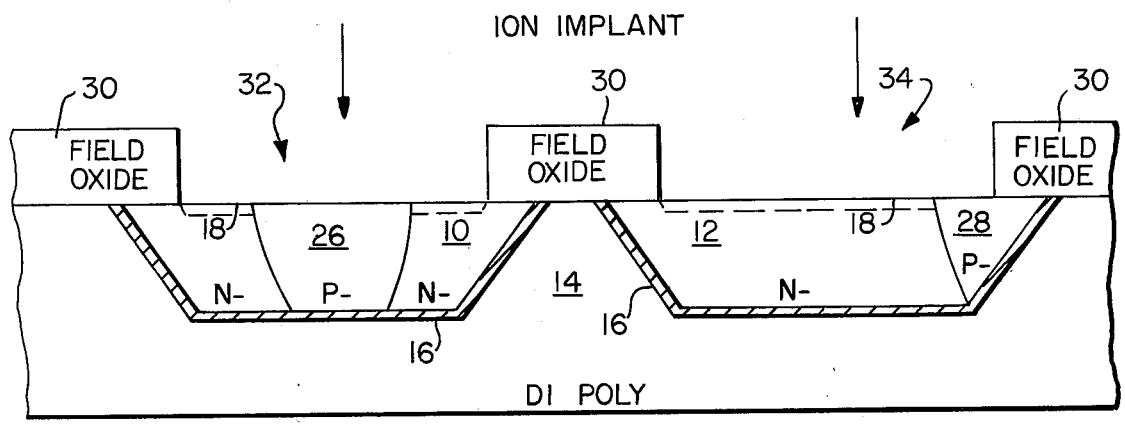

Preferably, the P$^-$ well regions are formed using the photoresist 20 as a mask for ion implantation and then ion implanting a certain ion dose of P type impurities, preferably boron or a boron and arsenic mixture. The photoresist layer 20 is then stripped and a P$^-$ diffusion is performed to form wells 26 and 28, which intersect the dielectric barrier 16, as shown in FIG. 2.

The photoresist used must be easily removed after ion implantation, must block the implantation effectively from regions where the P type impurity is not desired, and must be easy to delineate. Both positive and negative resists have been used with Shipley and undiluted Waycoat working well. The implantation uses an implant energy of approximately 65,000 volts and an implant dosage of $2.0 \times 10^{-4}$ coulombs into an area of approximately 23.2 square centimeters. This implantation "pre-deposit" is then diffused at approximately 1200° C. to a depth of approximately 9 microns. P− well regions 26 and 28 have a sheet resistance of about 1100 ohms/square. During the diffusion, a layer of field oxide 30 is grown over planar surface 18.

Though the first doping which determines the threshold voltages of the N channel MOS's devices was performed using ion implantation, this doping may also be performed by a standard open tube deposition and diffusion. The ion implantation process is preferred since it involves fewer steps and better control and reproduceability of P− well sheet resistance.

Next, the regions which determine the device's geometry (called the "thin oxide" regions) are defined. Field oxide layers 30 is processed through a standard photoresist involving deposition of the photoresist, delineation of the photoresist and etching to form apertures 32 and 34 to expose surface regions 18 of islands 10 and 12, respectively. Using the field oxide 30 as a mask, a P type impurity implantation using boron for example, is performed. This counter dope operation is used to determine the P channel MOS device's, to be formed in island 12, threshold voltages. The doping has a negligible effect on the N channel MOS device's, to be formed in island 10, threshold because of the relative doping levels in the P well 26 (about $2 \times 10^{16}$ atoms/cc at the surface) to the N substrate 10 (about $1.0 \times 10^{15}$ atom/cc). The P type impurity implantation for the counter-doping operation is done with an implant energy of 42,000 volts and a dose of 1.2 to $1.5 \times 10^{-6}$ coulombs, into an area 23.2 cm$^2$, depending upon the desired P channel MOS device's threshold. The counter-doping (second ion implantation and subsequent diffusion) merely reduces the N- impurity concentration to N- of island 12 and does not change the conductivity type.

As the counter-doping implantation is done prior to gate oxide formation, the gate oxidation cycle must be taken into account to determine a given threshold voltage. Using, for example, a dose of $1.2 \times 10^{-6}$ coulombs with a dry O$_2$ grown gate oxide of approximately 750 angstroms at 1100° C. has resulted in a P channel MOS threshold of 1.0 volts. Using a similar cycle, but a 1200 angstroms gate oxide, results in a P channel threshold voltage of 1.5 volts approximately. N channel MOS threshold voltages near 1.0 volts are obtained with the present process using the 1,000 to 1200 ohms/square P− well and a 750 angstrom gate oxide.

Figure 3:
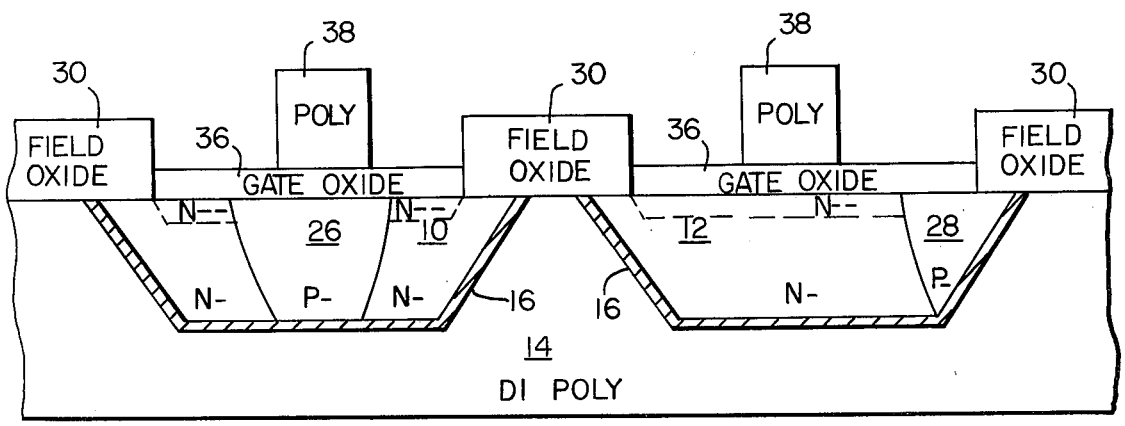

As shown in FIG. 3, the gate oxide 36 covers the total region above islands 10 and 12 in which the source drain and channel of the N and P channel devices are to be formed. A typical example of the field oxide is a thickness of approximately 5,000 angstroms and the gate oxide having a thickness of approximately 750 angstroms. It should be noted, if desired, that the gate oxide may be a sandwich combination of oxide and nitride.

Immediately after the gate oxidation, a phosphorous deposition is performed for mobile ion getting. A layer of polycrystalline silicon is then deposited over the wafer to a thickness of approximately 6,000 angstroms. The minimum thickness of the polysilicon layer 38 is chosen so that the polysilicon will be an effective mask against the N type diffusion which is used to dope the polysilicon and the P type and N type implantations which will form the N+ and P+ sources and drain regions of the MOS devices.

Next, all of the polysilicon layer 38 is heavily N type doped, with phosphorous for example, in a standard tube furnace. The final polysilicon sheet 38 has a resistance of approximately 75 ohms/square depending upon polysilicon thickness variations and the N+ type deposition cycle. The standard photoresist step involving deposition of the emulsion, exposure through a mask, developing and etching is performed to delineate the polysilicon gates 38 as illustrated in FIG. 3. It should be noted that the impurity concentration of the N+ dopant of the polysilicon must be sufficient to withstand the counter-doping which occurs when the polysilicon gate is exposed to a P+ ion implantation in the formation of source and drains in island 12.

The next step in the present process is the formation of source and drain regions by ion implantation through gate oxide regions 36. The impurity dopant atoms can be masked by either a photoresist, CVD oxide or aluminum. The choice of implantation mask is determined by the desirability of having a simple process with a fewest operations. The photoresist mask is the simplest mask used, but can only be used for low dose implantations or for implants where the wafer temperature is kept below approximately 140° C. For cases where the wafer temperature exceeds 140° C., the better choice is aluminum or CVD oxide or any other metal, such as molybdenum. Since the wafer temperature is a function of input power, photoresist is used in the present process to mask implantations in the energy range of up to 100 KCV and doses up to $5 \times 10^{-3}$ coulombs and aluminum is used for doses greater than $5 \times 10^{-3}$ coulombs into an area of 23.2 cm$^2$.

Figure 4:
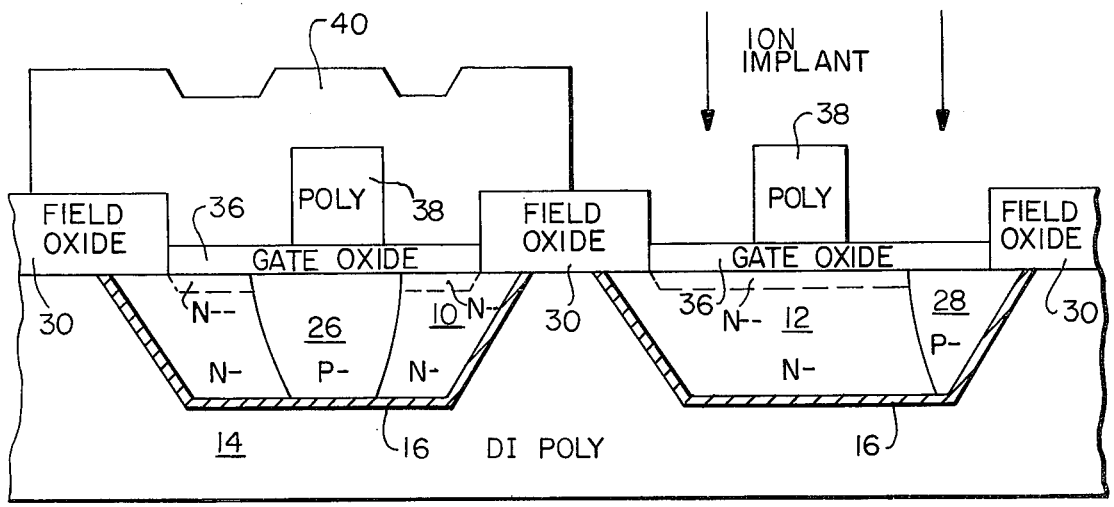
Figure 5:
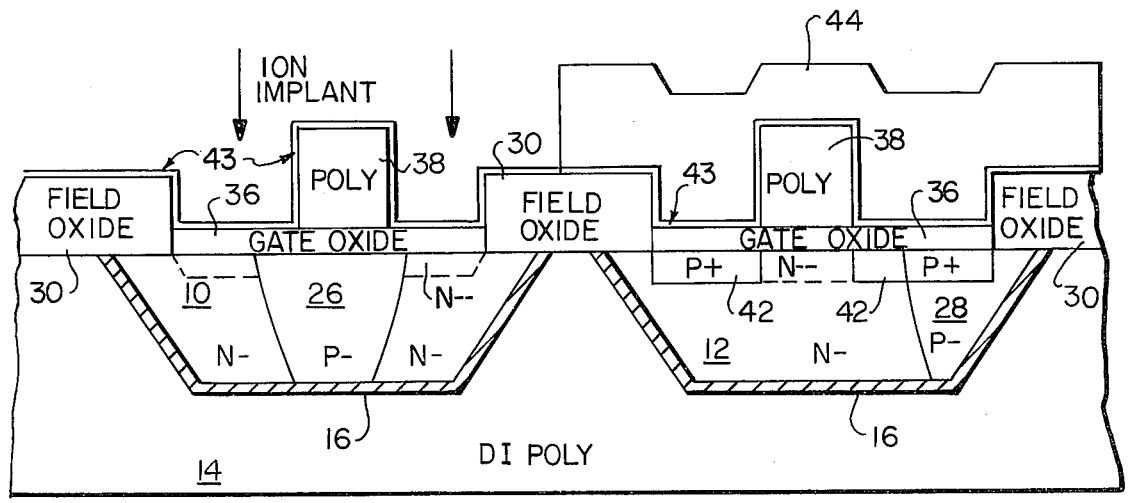

As illustrated in FIG. 4, a layer of photoresist 40 masks the region of island 10 and exposes island 12. The photoresist mask 40 is formed by the standard process of depositing, exposing, developing and etching the photoresist material. At P+ ion implantation is performed, using boron for example, to form source and drain regions 42 of the P channel device in island 12. As noted earlier, the counter-doping of the P+ implant does not effect the N+ dopant of the gate 38 because of the relative impurity concentration. The source and drain regions 42 were formed using the self-aligned gate process using polysilicon gate 38 as the alignment mask.

The photoresist layer 40 is stripped. A thin layer of oxide 43, approximately 500 angstroms, is grown over gates 38 of islands 10 and 12 12 to protect it from the subsequently deposited aluminum layer during the N+ implantation cycle. This protective layer is needed because the temperatures of the wafer could reach 400° C. An aluminum layer 44 is applied to the wafer and delineated by using a photoresist and etch process to expose the surface regions of island 10 in which the source and drain of the N channel device are to be formed. Using the polysilicon gate 38 as an alignment mask, an N+ ion implantation, using phosphorous for example, is performed to form source and drain 48 in island 10. After the aluminum layer 44 is removed, a dielectric layer 50 of silox, for example, is deposited. It should be noted that the layer 50 may also be a silox-silicon nitride sandwich if so desired.

The final sheet resistance of N+ source and drains 48 is approximately 30 ohms/square and the sheet resistance of the P+ source and drains 42 is approximately 60 ohms per square. The source and drains 42 and 48 have a junction depth of approximately 1 micron.

As noted previously, mask layer 40 may have been aluminum instead of a photoresist. Similarly, if the N+ implantation to form sources and drains 48 was carried out at a lower temperature, mask 44 may have been a photoresist.

Figure 6:
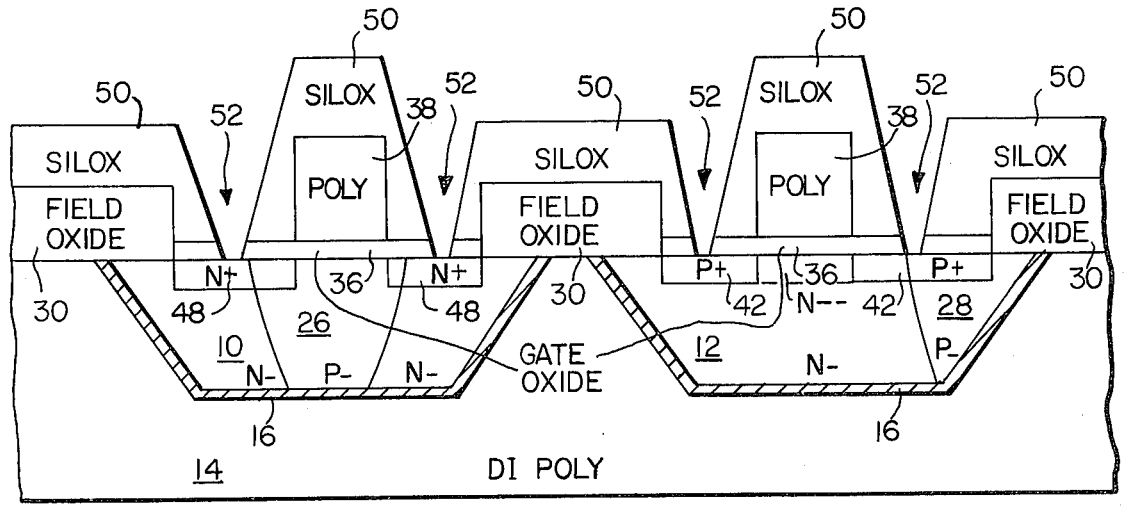
Figure 7:
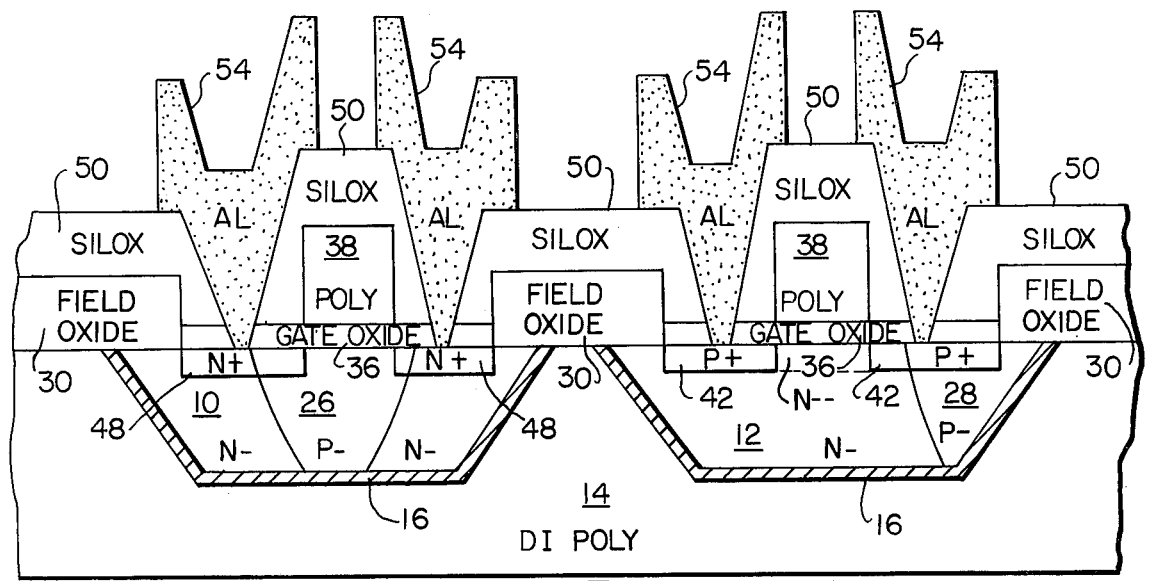

Contact apertures 52 are opened in silox layer 50 and the gate oxide layer 36 to expose the source and drain regions 42 and 48, resulting in the structure of FIG. 6. This is achieved using a standard photoresist and etch. A layer of contact metal 54, aluminum for example, is deposited upon the wafer and delineated to form the system interconnect structure which is shown in FIG. 7.

Figure 8:
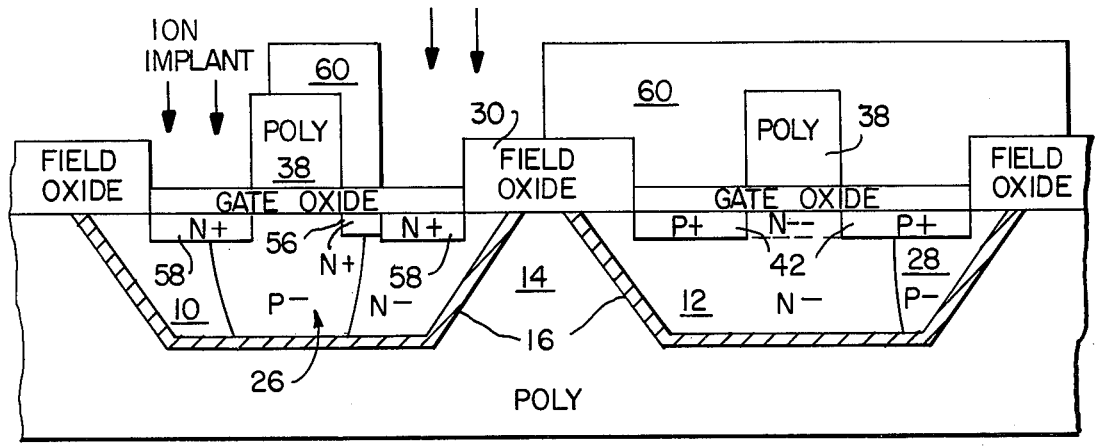
FIGS. 8 and 9 illustrate alternate process steps of the present invention.

The above process results in devices which will work with supply voltages of up to 10 volts. At voltage greater than 10 volts, depending slightly upon MOS device channel length, the N channel MOS will exhibit a breakdown phenomena associated with its parasitic substrate, lateral N+PN+ bipolar junction transistor. This phenomena, known as "snapback," is related to the lateral transistor $BV_{CER}$. To extend the operating voltage of the N channel device, an implantation/photoresist cycle is used as shown in FIG. 8. In this altered process, a region 56 of higher sheet resistance is implanted connecting the edge of the polysilicon gate 38 to the N+ contact region 58. Region 56 is implanted using photo-resist mask similar to aluminum mask 44. This approach can increase the N channel breakdown voltage to numbers, for example, greater than 50 volts. The P channel MOS device already has a breakdown voltage limited only by the channel length. For example, the P channel device will "punch-through" for small channel lengths on the order of 0.1 mil and typically for the large channel lengths greater than 0.2 mil will have a breakdown voltage greater than 30 volts.

In the altered process, the N type ion implantation, using phosphorous for example, for the offset drain region, is masked using the standard photoresist process. The ion implantation is through apertures in layer 44 of photoresist to form region 56. The dose for the ion implantation is approximately 3 to 5 $\times$ 10$^{-5}$ coulombs for a 1,000 angstrom gate oxide. The sheet resistance of region 56 is 900 to 1,000 ohms/square. The separation of the N+ contact to region 58 from the P− well 26 is chosen to maintain an N+ − P− breakdown voltage greater than the desired operating voltage. For a 15 volt operating voltage, 0.25 mils separation has been used. Region 58 is formed using aluminum mask 60 in a manner similar to the formation of region 48.

Figure 9:
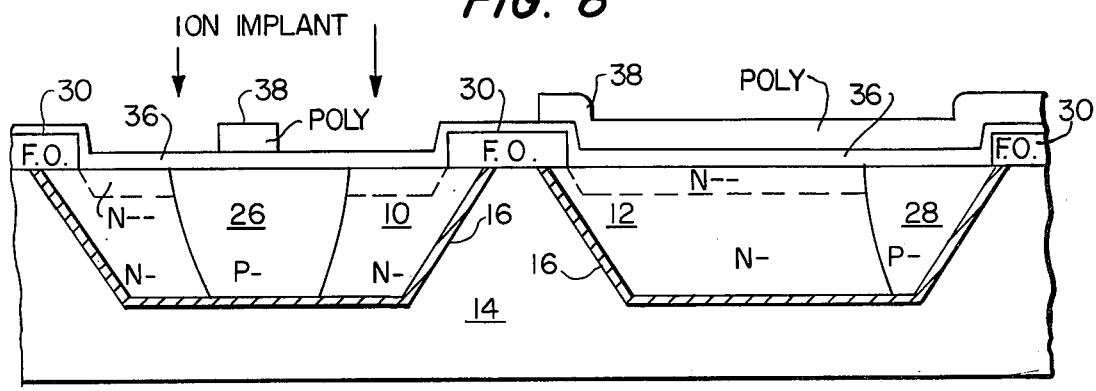

Another variation of the process is shown in FIG. 9 wherein after the deposition of a polysilicon layer 38, a photo-resist process is used to delineate only the gate over island 10. The N+ ion deposition is then performed first to form the regions 48 of the N channel device in island 10, while leaving the polysilicon over island 12 as a mask. This process is illustrated in FIG. 9 and uses only one N+ ion deposition to form the source and drains 48 and to dope the polysilicon layer 38. The process then proceeds with the masking of the islands 10 and the P+ ion implantation to form source and drain 42 in island 12.

The process disclosed results in more compact CMOS structures with improved performance due to the self-aligning gate feature and the control of threshold voltages using ion implantation. The process steps are simple and only one high temperature deposition is used in the process. The process is shown to be practical and feasible to process CMOS circuits.

What is claimed:

1. A process for fabricating complementary metal oxide field effect devices in a substrate of a first conductivity type having a flat surface comprising the steps of:
   selectively doping a portion of a first region of said substrate in which a channel of a first device is to be formed with impurities opposite to said first conductivity type of an amount sufficient to change the conductivity type of the selectively doped portion for determining the threshold voltage of said first device;
   doping a second region of said substrate, spaced from said first region, in which a channel of a second device, of a channel type opposite the channel type of said first device, is to be formed with impurities of said opposite conductivity type of an amount sufficient to only reduce the impurity concentration without changing the conductivity type of said second region for determining the threshold voltage of said second device; and
   thereafter forming a gate oxide layer on each of said regions, forming a channel defining gate on each layer of said gate oxide layer and forming source and drain zones for said devices using said gates as alignment masks.

2. A process as in claim 1 wherein said second mentioned doping step includes:
   forming a mask on said flat surface to define first and second surface areas in which the source, drain and channel of said first and second devices are to be formed; and
   doping said defined first and second areas.

3. A process as in claim 2 wherein said gate oxide is formed on said defined areas using said mask.

4. A process as in claim 3 wherein forming said mask includes forming a first oxide layer on said flat surface and forming apertures through said first oxide layer to expose said defined areas of said flat surface and wherein said gate oxide is formed by forming a second oxide layer over said exposed areas.

5. A process as in claim 1 wherein said first mentioned doping step includes:
   ion implanting impurities of said opposite conductivity type in said portion of said first region while masking said second region, and
   diffusing said implanted impurities into said portion of said first region.

6. A process as in claim 5 wherein said first mentioned doping step includes:
   forming a mask on said flat surface before ion implantation; and
   removing said mask after ion implantation and before diffusing.

7. A process as in claim 6 wherein said mask is a photoresist material.

8. A process as in claim 5 wherein said opposite conductivity mentioned doping step includes ion implanting impurities of said second type.

9. A process as in claim 1 wherein forming said gate and forming said source and said drains includes:
   applying a layer of gate material on said gate oxide layer;
   removing a portion of the gate material from said first device to form a gate; and
   doping with impurities of said first conductivity type using said gate material as a mask to form said first device's source and drain zones.

10. A process as in claim 9 including forming a mask adjacent said flat surface to define portions of said flat surface in which said source and drain zones of said second device are to be formed and doping with impurities of said opposite conductivity type to form said second device's source and drain zones.

11. A process as in claim 9 wherein said gate material is polycrystalline silicon.

12. A process as in claim 11 wherein said gate material is a layer of silicon nitride and a layer of polycrystalline silicon.

13. A process as in claim 1 wherein forming said gate includes applying a layer of gate material on said gate oxide layer and removing portions of said gate material to define said gates and expose portions of said gate oxide for all devices.

14. A process as in claim 13 wherein forming said source and drain zones includes applying a layer or first masking material on all first devices;

doping with impurities of said opposite conductivity type using said gate material as a mask for the source and drain zones;

removing said first masking material and applying a layer of second masking material on all second devices;

doping with impurities of said first conductivity type using said gate material as a mask for the source and drain zones.

15. A process as in claim 14 wherein said first masking material is a photoresist emulsion and said second masking material is aluminum.

16. A process as in claim 14 wherein said first and second masking materials are photoresist emulsions.

17. A process as in claim 14 wherein said first and second masking materials are aluminum.

18. A process as in claim 14 wherein said dopings are achieved by ion implantation.

19. A process as in claim 1 wherein said first mentioned doping step includes an open tube diffusion and said second mentioned doping step includes ion implantation and diffusion.

20. A process as in claim 1 wherein the gate of said first device is part of a mask used for forming a first portion of said first device's drain zone in a first step to have a first resistive value and as part of a mask used to simultaneously form said first device's source zone and a second portion of said drain zone in a second step of a resistive value different than said first resistive value.

* * * * *

UNITED STATES PATENT AND TRADEMARK OFFICE
CERTIFICATE OF CORRECTION

PATENT NO. : 4,075,754
DATED : Feb. 28, 1978
INVENTOR(S) : Cook, Jr.

It is certified that error appears in the above–identified patent and that said Letters Patent are hereby corrected as shown below:

Claim 14, line 2  delete "or" and insert -- of --.

Signed and Sealed this

Twentieth Day of June 1978

[SEAL]

Attest:

RUTH C. MASON
Attesting Officer

DONALD W. BANNER
Commissioner of Patents and Trademarks